United States Patent
Liu et al.

(10) Patent No.: US 9,437,303 B1
(45) Date of Patent: Sep. 6, 2016

(54) PROGRAMMING METHOD OF MEMORY ARRAY

(71) Applicant: MACRONIX International Co., Ltd., Hsinchu (TW)

(72) Inventors: Chu-Yung Liu, Hsinchu (TW); Hsing-Wen Chang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/834,809

(22) Filed: Aug. 25, 2015

(51) Int. Cl.
*G11C 16/34* (2006.01)
*G11C 16/10* (2006.01)
*G11C 16/04* (2006.01)

(52) U.S. Cl.
CPC ........... *G11C 16/10* (2013.01); *G11C 16/0483* (2013.01); *G11C 16/3459* (2013.01)

(58) Field of Classification Search
CPC ... G11C 16/0483; G11C 16/12; G11C 16/10; G11C 16/3427; G11C 16/3418; G11C 16/3459; G11C 16/3454; G11C 16/3481
See application file for complete search history.

(56) References Cited

U.S. PATENT DOCUMENTS 8,611,150 B2 * 12/2013 Shin .................... G11C 11/5642
365/185.03
2012/0127791 A1 * 5/2012 Lee .................... G11C 16/3459
365/185.03

* cited by examiner

*Primary Examiner* — Andrew Q Tran
(74) *Attorney, Agent, or Firm* — J.C. Patents

(57) ABSTRACT

A programming method of a memory array is provided and includes following steps, wherein the memory array includes a target memory cell and two periphery memory cells electrically connected to a first word line. After a first programming operation is performed on the target memory cell, the target memory cell and the two periphery memory cells are verified to obtain a first verification result. Whether to perform a second programming operation or a third programming operation on the target memory cell is determined according to the first verification result. The step of performing the second programming operation or the third programming operation on the target memory cell includes: turning off a first transistor and a second transistor; and increasing a level of a passing voltage for turning on a plurality of non-target memory cells and a level of a programming voltage transmitted by the first word line.

10 Claims, 7 Drawing Sheets

PROGRAMMING METHOD OF MEMORY ARRAY

BACKGROUND OF THE INVENTION

1. Field of the Invention

The invention relates to an operating method of a memory, and more particularly, to a programming method of a memory array.

2. Description of Related Art

A flash memory can adopt a memory array having a NAND architecture. In particular, a NAND memory array includes a plurality of memory cell strings, and the storage state of the memory cells in the memory cell strings can be changed through a programming operation. In terms of the programming of the memory array, the state of the memory cell strings can be switched to a inhibit state or a selected state to stop or perform the programming of the memory cells in the memory cell strings. Moreover, the programming of the memory array can adopt an incremental step pulse program (ISPP) method to repeatedly apply a programming voltage to the memory cells and to increase the level of the programming voltage in every cycle operation.

However, as the size of the memory cells is reduced, programming of the memory array adopting an ISPP method is often very readily affected by parasitic capacitors. For instance, during the programming process of the memory array, each of the memory cell strings respectively forms a channel, and parasitic capacitor may be generated between a floating gate of a memory cell and a channel of an adjacent memory cell string thereof. Moreover, when the states of two adjacent memory cell strings are different, the parasitic capacitor between the floating gate of the memory cell and an adjacent channel thereof causes the distribution of the threshold voltage corresponding to the storage state of the memory cell to increase, such that the programming method of the memory array adopting an ISPP method often cannot meet the application of a multi-level cell (MLC). Therefore, how to avoid the influence to the programming of the memory array caused by the parasitic capacitor between the floating gate of the memory cells and an adjacent channel thereof is a current and important topic to be solved by industries.

SUMMARY OF THE INVENTION

The invention provides a programming method of a memory array capable of preventing the programming of the memory array from being influenced by the parasitic capacitor between a floating gate of a target memory cell and an adjacent channel thereof.

A programming method of a memory array of the invention includes the following steps, and the memory array includes a target memory cell electrically connected to a first word line, two periphery memory cells electrically connected to the first word line and adjacent to the target memory cell, and a plurality of non-target memory cells, a first transistor, and a second transistor connected to the target memory cell in series. A first programming operation is performed on the target memory cell, wherein the step of performing the first programming operation on the target memory cell includes: turning on the first transistor and turning off the second transistor; and turning on the plurality of non-target memory cells by using a passing voltage and increasing the level of a programming voltage transmitted by the first word line. The target memory cell and the two periphery memory cells are verified through at least one verification operation after the first programming operation is performed on the target memory cell to obtain a first verification result. Whether to perform a second programming operation or a third programming operation on the target memory cell is determined according to the first verification result, wherein the step of performing the second programming operation or the third programming operation on the target memory cell includes: turning off both the first transistor and the second transistor; and increasing the level of the passing voltage for turning on a plurality of non-target memory cells and the level of the programming voltage transmitted by the first word line.

Based on the above, in the invention, after the first programming operation is performed on the target memory cell, whether the second programming operation or the third programming operation is performed on the target memory cell is determined according to the first verification result of the target memory cell and the two periphery memory cells. Accordingly, influence to the programming of the memory array caused by the parasitic capacitor between the floating gate of the target memory cell and an adjacent channel thereof can be avoided.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
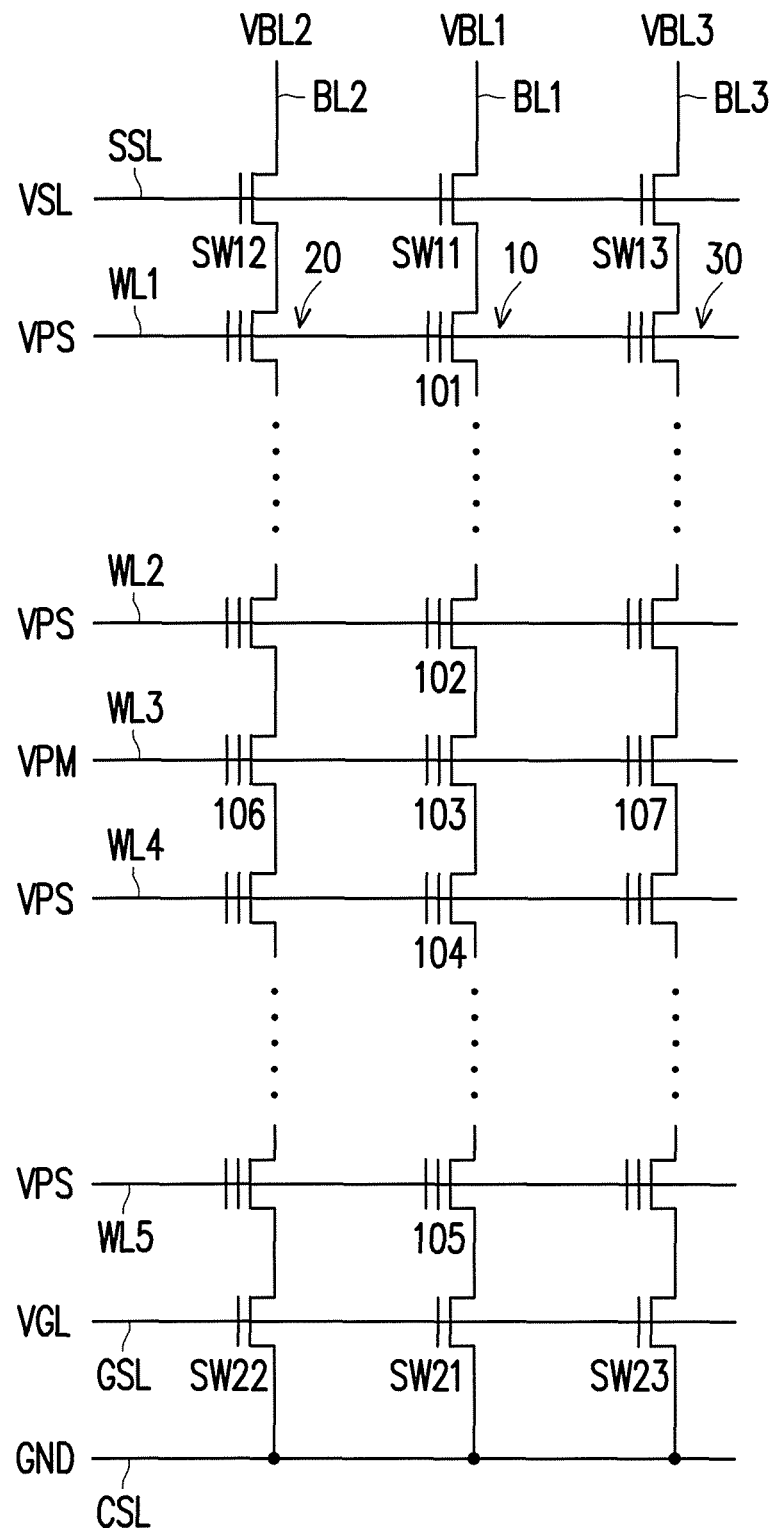
FIG. 1 is a schematic of a memory array according to an embodiment of the invention.

FIG. 1 is a schematic of a memory array according to an embodiment of the invention. Referring to FIG. 1, a memory array 100 can be, for instance, a NAND memory array, and includes a plurality of first transistors SW11 to SW13, a plurality of memory cell strings 10 to 30, and a plurality of second transistors SW21 to SW23. In particular, the first transistors SW11 to SW13 are electrically connected to a string selection line SSL. The second transistors SW21 to SW23 are electrically connected to a ground selection line GSL. The memory cell strings 10 to 30 are electrically connected to word lines WL1 to WL5. Moreover, each of the memory cell strings includes a plurality of memory cells, and is connected in series between a corresponding bit line and a common source line CSL through the first transistors and the second transistors.

For instance, the memory cell string 10 includes memory cells 101 to 105, and the memory cells 101 to 105, the first transistor SW11, and the second transistor SW21 are connected in series between a bit line BL1 and the common source line CSL. Similarly, the memory cell string 20, the first transistor SW12, and the second transistor SW22 are connected in series between a bit line BL2 and the common source line CSL, and the memory cell string 30, the first transistor SW13, and the second transistor SW23 are connected in series between a bit line BL3 and the common source line CSL. Moreover, the memory cells in the memory array 100 can be multi-level cells (MLC) having a plurality of storage states.

In operation, a memory control circuit (not shown) can provide a corresponding voltage to the memory array 100 according to address information to program the memory array 100. For instance, a row decoder (not shown) in the memory control circuit can provide a selection voltage VSL, a passing voltage VPS, a programming voltage VPM, and a selection voltage VGL to the memory array 100, and a column decoder (not shown) in the memory control circuit can provide bit line voltages VBL1 to VBL3 to the memory array 100 to program the memory cells (such as the memory cell 103) in the memory array 100. During the programming operation of the memory cell 103, the memory cell 103 is regarded as the target memory cell, and the memory cells 101, 102, 104, and 105 are regarded as the non-target memory cells. Moreover, two memory cells 106 and 107, which are electrically connected to the word line WL3 and adjacent to the memory cell 103, are regarded as two periphery memory cells.

Figure 2:
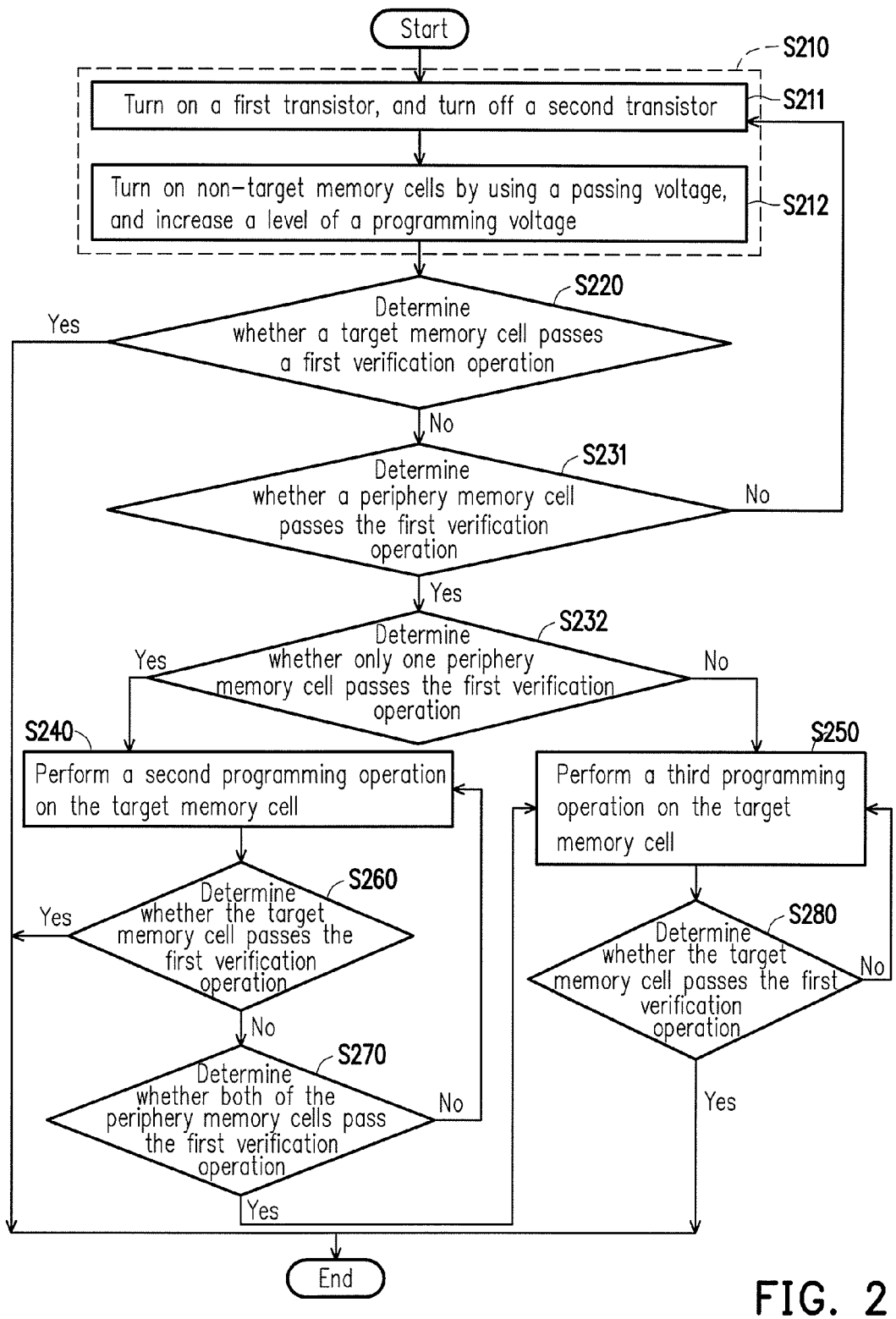
FIG. 2 is a flow chart of a programming method of a memory array according to an embodiment of the invention.

To allow those having ordinary skill in the art better understand the present embodiment, FIG. 2 is a flow chart of a programming method of a memory array according to an embodiment of the invention, and in the following, the programming operation of the target memory cell 103 is further explained with reference to FIG. 1 and FIG. 2.

Figure 3:
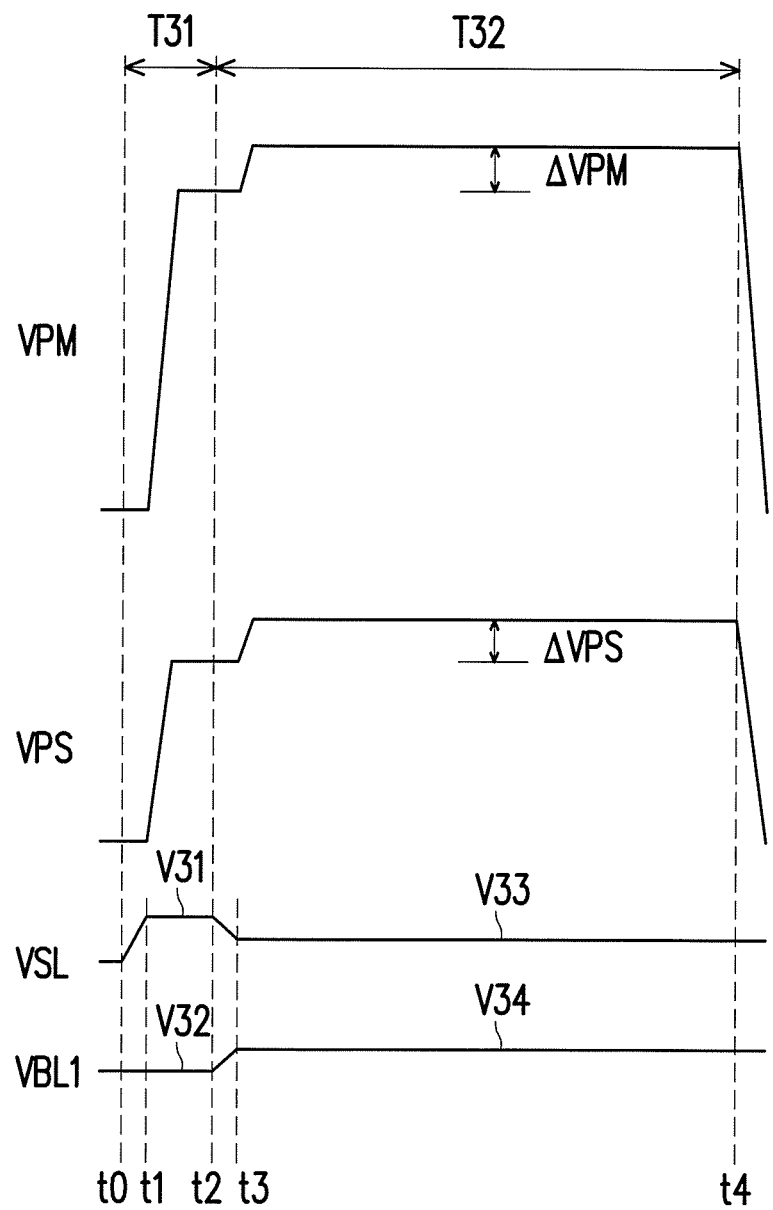
FIG. 3 is a waveform schematic of a programming operation according to an embodiment of the invention.

As shown in step S210, a first programming operation can be performed on the target memory cell 103. Specifically, in terms of the detailed steps of step S210, as shown in step S211, in the first programming operation, the first transistor SW11 is turned on, and the second transistor SW21 is turned off. For instance, FIG. 3 is a waveform schematic of a programming operation according to an embodiment of the invention. As shown in FIG. 3, a first programming operation can be performed on the target memory cell 103 during a first period T31. Specifically, between times t0 and t1, the selection voltage VSL transmitted by the string selection line SSL is gradually increased to a first level V31, and between times t1 and t2, the selection voltage VSL is maintained at the first level V31.

Between times t0 and t2, a bit line voltage VBL1 transmitted by the bit line BL1 is maintained at a second level V32 (such as a ground voltage). Accordingly, the memory cell string 10 can be set to a selected state to perform programming on the target memory cell 103 in the memory cell string 10. Moreover, between times t1 and t2, the voltage difference between the selection voltage VSL and the bit line voltage VBL1 is greater than the threshold voltage of the first transistor SW11, and therefore the first transistor SW11 can be turned on. Moreover, the selection voltage VGL transmitted by the ground selection line GSL is maintained at the ground voltage so as to turn off the second transistor SW21.

As shown in step S212, in the first programming operation, the non-target memory cells 101, 102, 104, and 105 are turned on by using the passing voltage VPS, and the level of the programming voltage VPM provided to the bit line WL3 is increased. For instance, as shown in FIG. 3, the passing voltage VPS transmitted by the word lines WL1, WL2, WL4, and WL5 begins to be gradually increased to a predetermined level from time t1, so as to turn on the non-target memory cells 101, 102, 104, and 105. The programming voltage VPM is transmitted to the target memory cell 103 through the word line WL3. Moreover, the programming method of the memory array adopts an incremental step pulse program (ISPP) method to increase the level of the programming voltage VPM. For instance, in every first programming operation, the level of the programming voltage VPM provided to the bit line WL3 is increased by a predetermined amount (such as 1 V).

In this way, the memory cell string 10 can form a channel, that is, the semiconductor body of the target memory cell 103 can form a channel. Moreover, the programming voltage VPM can be coupled to the floating gate of the target memory cell 103. Accordingly, a large electric field can be generated across an oxide layer of the target memory cell 103, thus inducing electrons in the channel of the semiconductor body to be injected into the floating gate of the target memory cell 103 through a Fowler-Nordheim (FN) tunneling method, so as to program the target memory cell 103.

As shown in step S220, the first verification operation can be performed on the target memory cell 103 to determine whether the target memory cell 103 passes the first verification operation by using a first verification voltage. For instance, if the threshold voltage of the target memory cell 103 is greater than the first verification voltage, the target memory cell 103 can be determined to have passed the first verification operation, and therefore the programming of the target memory cell 103 can be ended. Moreover, when the threshold voltage of the target memory cell 103 is not greater than the first verification voltage, step S231 is performed.

In step S231, the first verification operation is respectively performed on the two periphery memory cells 106 and 107 to respectively determine whether the two periphery memory cells 106 and 107 pass the first verification operation by using the first verification voltage. Moreover, whether a periphery memory cell passes the first verification operation can be further determined according to the results of the first verification operation of the two periphery memory cells 106 and 107. If a periphery memory cell passes the first verification operation, as shown in step S232, whether only one periphery memory cell passes the first verification operation can be further determined. In other words, through step S231 and step S232, it can be determined that neither of the two periphery memory cells 106 and 107 passes the first verification operation, both of the two periphery memory cells 106 and 107 pass the first verification operation, or only one of the two periphery memory cells 106 and 107 passes the first verification operation.

When neither of the periphery memory cells 106 and 107 passes the first verification operation, neither of the programming operations of the two periphery memory cells 106 and 107 has ended. That is, the memory cell string 10 and the two memory cell strings 20 and 30 are all maintained at the same state (i.e., selected state). Therefore, step S210 is repeated to continuously program the target memory cell 103 through the first programming operation. Moreover, if a periphery memory cell passes the first verification operation, at least one memory cell string in the two memory cell strings 20 and 30 is set to a inhibit state. That is, at least one bit line voltage in the bit line voltages VBL2 and VBL3 is set to the supply voltage. At this point, the states of the memory cell string 10 and an adjacent memory cell string are different, and therefore the target memory cell 103 is programmed by adopting the second programming operation or the third programming operation to avoid the influence caused by the parasitic capacitor between the floating gate of the target memory cell 103 and an adjacent channel thereof. For instance, when only one of the two periphery memory cells 106 and 107 passes the first verification operation, as shown in step S240, a second programming operation is performed on the target memory cell 103. Moreover, when both of the periphery memory cells 106 and 107 pass the first verification operation, a third programming operation is performed on the target memory cell 103.

In other words, after the first programming operation is performed on the target memory cell 103, the target memory cell 103 and the two periphery memory cells 106 and 107 are verified through the first verification operation so as to obtain a first verification result, and whether to perform the second programming operation or the third programming operation on the target memory cell 103 is determined according to the first verification result. Namely, whether to perform 1 the second programming operation on the target memory cell 103 is determined according to the first verification result, and whether to perform the third programming operation on the target memory cell 103 is determined according to the first verification result.

It should be mentioned that, during the second programming operation or the third programming operation, the first transistor SW11 and the second transistor SW21 are turned off, and the level of the passing voltage VPS and the level of the programming voltage VPM are increased. Accordingly, the ISPP slope in the second programming operation or the third programming operation can be less than the ISPP slope in the first programming operation, and therefore the influence caused by the parasitic capacitor between the floating gate of the target memory cell 103 and an adjacent channel thereof can be avoided.

Figure 4:
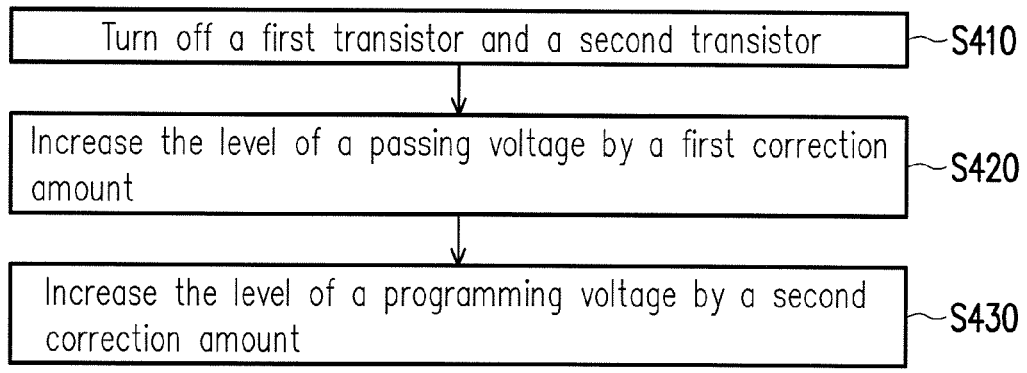
FIG. 4 is a flow chart of a second programming operation according to an embodiment of the invention.
Figure 5:
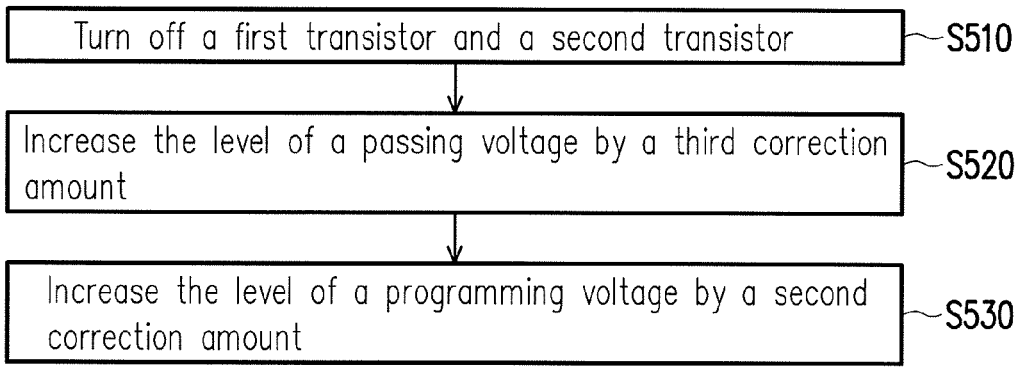
FIG. 5 is a flow chart of a third programming operation according to an embodiment of the invention.

Specifically, FIG. 4 is a flow chart for explaining the second programming operation according to an embodiment of the invention, and FIG. 5 is a flow chart for explaining the third programming operation according to an embodiment of the invention. Referring to FIGS. 1, 3, and 4, in the second programming operation, as shown in step S410, the first transistor SW11 and the second transistor SW21 are turned off. For instance, as shown in FIG. 3, the second programming operation can be performed on the target memory cell 103 during a second period T32. Specifically, between times t2 and t3, the selection voltage VSL is gradually decreased to a third level V33, and the bit line voltage VBL1 is gradually increased to a fourth level V34.

Accordingly, between times t3 and t4, the voltage difference between the selection voltage VSL and the bit line voltage VBL1 is less than the threshold voltage of the first transistor SW11, and therefore the first transistor SW11 can be turned off. Moreover, between times t2 and t4, the selection voltage VGL transmitted by the ground selection line GSL is maintained at the ground voltage so as to turn off the second transistor SW21. Moreover, as shown in step S420, the level of the passing voltage VPS begins to increase from time t3, and is increased by a first correction amount ΔVPS between times t3 and t4. Moreover, as shown in step S430, the level of the programming voltage VPM begins to increase from time t3, and is increased by a second correction amount ΔVPM between times t3 and t4.

In other words, between times t3 and t4, the first transistor SW11 and the second transistor SW21 are maintained at a non-conducting state. Moreover, the voltage difference across the oxide layer of the target memory cell 103 can be changed by adjusting the first correction amount ΔVPS and the second correction amount ΔVPM, and therefore the FN tunneling current of the target memory cell 103 can be decreased when the target memory cell 103 is continuously programmed, so that the ISPP slope can be reduced. Similarly, in the third programming operation, as shown in step S510, the first transistor SW11 and the second transistor SW21 are turned off. Moreover, as shown in step S520 and step S530, the level of the passing voltage VPS is increased by a third correction amount, and the level of the programming voltage VPS is increased by the second correction amount. Moreover, the third correction amount is greater than the second correction amount to more significantly reduce the ISPP slope. In other words, the ISPP slope in the first programming operation is greater than the ISPP slope in the second programming operation, and the ISPP slope in the second programming operation is greater than the ISPP slope in the third programming operation.

Figure 6:
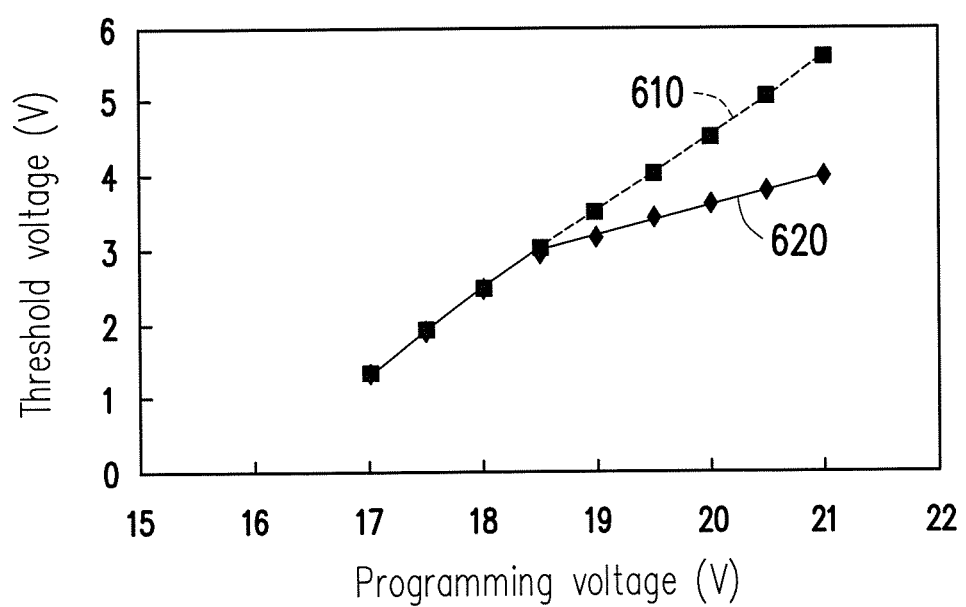
FIG. 6 is a curve diagram of the variation amount of each of a programming voltage and the threshold voltage of a target memory cell according to an embodiment of the invention.

For instance, FIG. 6 is a curve diagram of the variation amount of each of the programming voltage and the threshold voltage of a target memory cell according to an embodiment of the invention. Referring to FIG. 6, after the programming voltage VPM is greater than 18.5 V, only one of the two periphery memory cells 106 and 107 may have passed the first verification operation. If neither of the two periphery memory cells 106 and 107 passes the first verification operation, as shown in a curve 610, the target memory cell 103 can be continuously programmed through the first programming operation, and the ISPP slope of the curve 610 can be, for instance, 1. If only one of the two periphery memory cells 106 and 107 passes the first verification operation, as shown in a curve 620, the target memory cell 103 can be programmed through a second programming operation, and the ISPP slope of the curve 620 can be, for instance, 0.8.

It should be mentioned that, when the states of the memory cell string 10 and an adjacent memory cell string are different, that is, when a periphery memory cell passes the first verification operation, parasitic capacitor between the floating gate of the target memory cell 103 and an adjacent channel thereof causes the gate-coupling ratio (GCR) to be increased. Therefore, in the programming method of a memory array of the present embodiment, by reducing the ISPP slope to decrease the FN tunneling current of the target memory cell 103, the influence caused by the parasitic capacitor between the floating gate of the target memory cell 103 and an adjacent channel thereof can be avoided. Moreover, when only one of the two periphery memory cells 106 and 107 passes the first verification operation, the states of the memory cell string 10 and an adjacent memory cell string are different, and therefore at this point, the ISPP slope can be reduced by a lesser amount by using a second programming operation. Moreover, when both of the two periphery memory cells 106 and 107 pass the first verification operation, the state of the memory cell string 10 is respectively different from the states of two adjacent memory cell strings, and therefore at this point, the ISPP slope can be reduced by a greater amount through a third programming operation.

Referring further to FIG. 1 and FIG. 2, after the second programming operation is performed on the target memory cell 103, as shown in step S260 and step S270, the target memory cell 103 and the two periphery memory cells 106 and 107 can be verified through the first verification operation to obtain a second verification result, and whether to perform the second programming operation or the third programming operation on the target memory cell 103 again can be determined according to the second verification result. For instance, when the target memory cell 103 does not pass the first verification operation, and neither of the two periphery memory cells 106 and 107 passes the first verification operation, step S240 is repeated to continuously program the target memory cell 103 through the second programming operation.

Moreover, after the third programming operation is performed on the target memory cell 103, as shown in step S280, the target memory cell 103 is verified through the first verification operation to obtain a third verification result, and whether to perform the third programming operation on the target memory cell 103 again is determined according to the third verification result. For instance, when the target memory cell 103 does not pass the first verification operation, the target memory cell 103 is continuously programmed through the third programming operation until the target memory cell 103 passes the first verification operation.

It should be mentioned that, in the embodiment of FIG. 2, whether the target memory cell 103 is programmed to the desired storage state is first determined by using the first verification operation, and when the target memory cell 103 has not reached the desired storage state, the target memory cell 103 is programmed through the second programming operation or the third programming operation according to the verification results of the two periphery memory cells 106 and 107. However, in another embodiment, whether the target memory cell 103 is close to the desired storage state can also be first determined through a second verification operation when the target memory cell 103 has not reached the desired storage state, and the target memory cell 103 is further programmed through the second programming operation or the third programming operation according to the verification results of the two periphery memory cells 106 and 107 when the target memory cell 103 is close to the desired storage state.

Figure 7A:
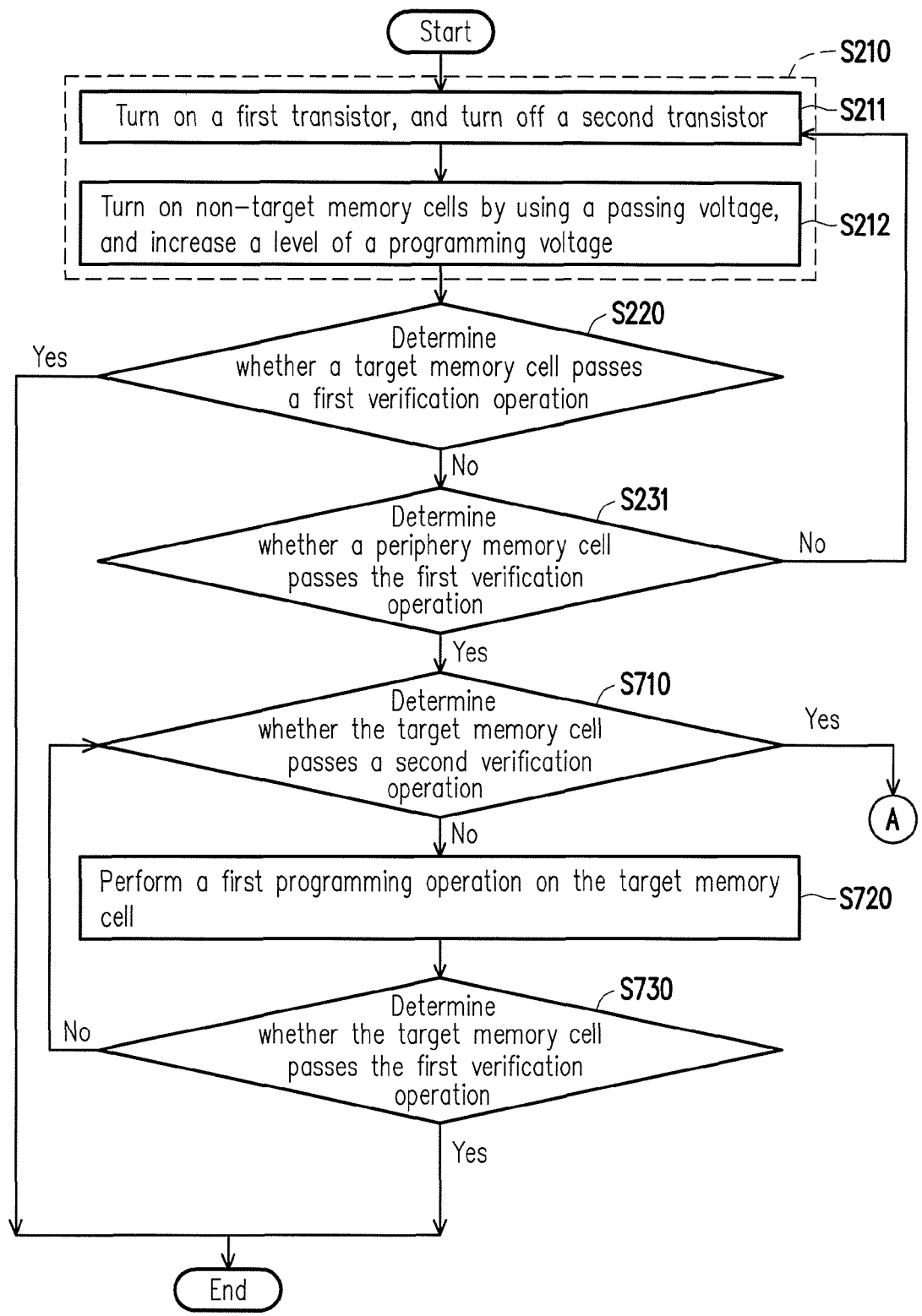
FIGS. 7A and 7B are a flow chart of a programming method of a memory array according to another embodiment of the invention.
Figure 7B:
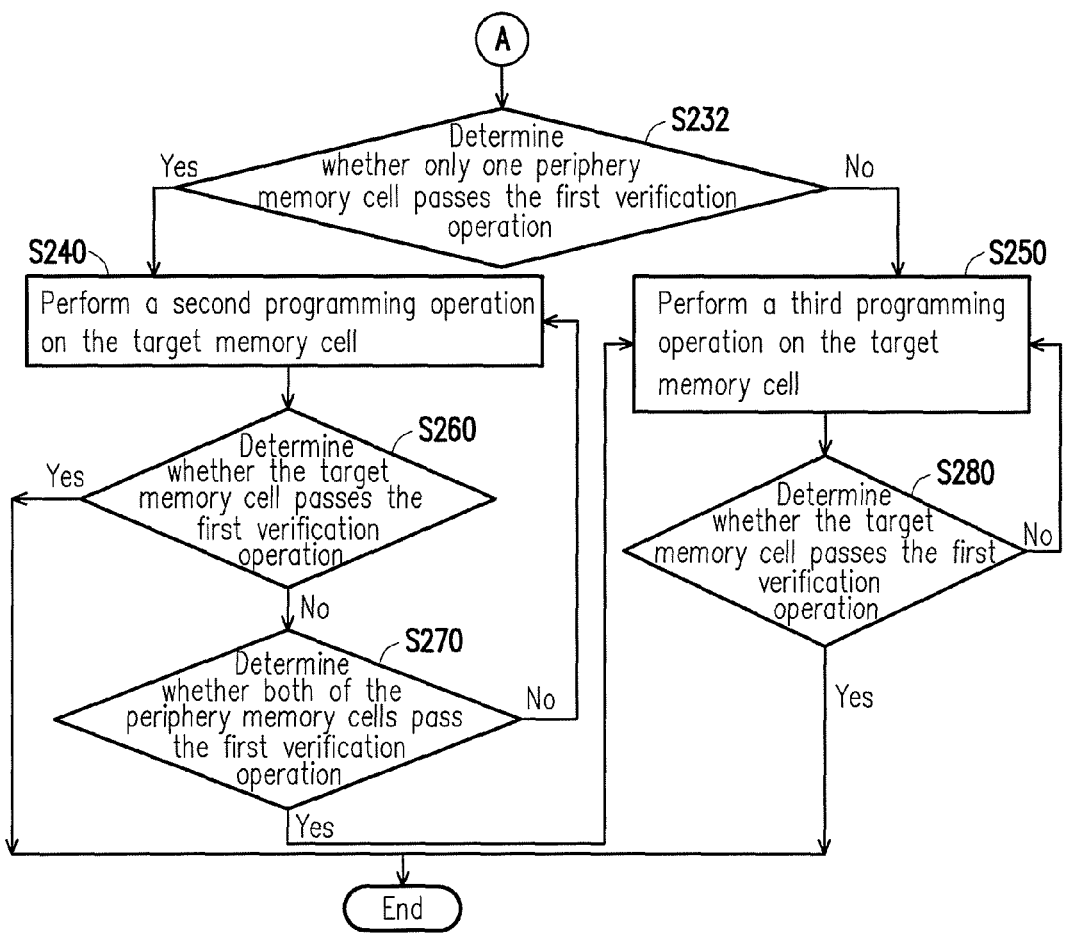

For instance, FIGS. 7A and 7B are a flow chart of a programming method of a memory array according to another embodiment of the invention. As shown in FIG. 7A, when the target memory cell 103 does not pass the first verification operation, and one of the two periphery memory cells 106 and 107 passes the first verification operation (i.e., there is a periphery memory cell passing the first verification operation), as shown in step S710, a second verification operation is performed on the target memory cell 103 to determine whether the target memory cell 103 passes the second verification operation by using the second verification voltage, wherein the second verification voltage is less than the first verification voltage. For instance, the first verification voltage can be, for instance, 1 V, and the second verification voltage can be, for instance, 0.8 V.

In other words, in the embodiment of FIGS. 7A and 7B, whether the target memory cell 103 is close to the desired storage state can be first determined through the second verification operation. Moreover, when the target memory cell 103 does not pass the second verification operation, as shown in step S720 and step S730, the first programming operation and the first verification operation are performed on the target memory cell 103 again to determine whether to return to step S710. Moreover, when a periphery memory cell passes the first verification operation, and the target memory cell 103 has already passed the second verification operation, as shown in step S232, it can be determined that both of the two periphery memory cells 106 and 107 pass the first verification operation or only one of the two periphery memory cells 106 and 107 passes the first verification operation by referring to the verification results of the two periphery memory cells 106 and 107 in the first verification operation.

In other words, after the first programming operation is performed on the target memory cell 103, the target memory cell 103 and the two periphery memory cells 106 and 107 are verified through the first verification operation and the second verification operation so as to obtain a first verification result, and whether to perform the second programming operation or the third programming operation on the target memory cell 103 is determined according to the first verification result. Namely, whether to perform the second programming operation on the target memory cell 103 is determined according to the first verification result, and whether to perform the third programming operation on the target memory cell 103 is determined according to the first verification result.

Then, similarly to the embodiment of FIG. 2, when only one of the two periphery memory cells 106 and 107 passes the first verification operation, as shown in step S240, a second programming operation is performed on the target memory cell 103. Moreover, after the second programming operation is performed on the target memory cell 103, as shown in step S260 and step S270, the target memory cell 103 and the two periphery memory cells 106 and 107 can be verified through the first verification operation to obtain a second verification result, and whether to perform the second programming operation or the third programming operation on the target memory cell 103 again can be determined according to the second verification result.

Moreover, when both of the two periphery memory cells 106 and 107 pass the first verification operation, a third programming operation is performed on the target memory cell 103. Moreover, after the third programming operation is performed on the target memory cell 103, as shown in step S280, the target memory cell 103 is verified through the first verification operation to obtain a third verification result, and whether to perform the third programming operation on the target memory cell 103 again is determined according to the third verification result. Moreover, the detailed descriptions of steps S210, S220, S231, S232, and S240 to S280 in FIGS. 7A and 7B are as provided in each of the above embodiments, and are not repeated herein.

Based on the above, in the invention, a first programming operation, a second programming operation, or a third programming operation is performed on the target memory cell according to the verification results of the target memory cell and the two periphery memory cells. Moreover, in the second programming operation or the third programming operation, the FN tunneling current of the target memory cell can be decreased through the non-conduction of the first transistor and the second transistor and the adjustment of the level of each of the passing voltage and the programming voltage, so as to avoid the influence caused by the parasitic capacitor between the floating gate of the target memory cell and an adjacent channel thereof.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A programming method of a memory array, wherein the memory array comprises a target memory cell electrically connected to a first word line, two periphery memory cells electrically connected to the first word line and adjacent to the target memory cell, and a plurality of non-target memory cells, a first transistor, and a second transistor connected in series with the target memory cell, and the programming method comprises:
   performing a first programming operation on the target memory cell, wherein the step of performing the first programming operation on the target memory cell comprises:
      turning on the first transistor and turning off the second transistor; and
      turning on the non-target memory cells by using a passing voltage and increasing a level of a programming voltage transmitted by the first word line;
   verifying the target memory cell and the two periphery memory cells through at least one verification operation to obtain a first verification result after the first programming operation is performed on the target memory cell; and
   determining whether to perform a second programming operation or a third programming operation on the target memory cell according to the first verification result, wherein the step of performing the second programming operation or the third programming operation on the target memory cell comprises:
      turning off the first transistor and the second transistor; and
      increasing a level of the passing voltage for turning on the non-target memory cells and the level of the programming voltage transmitted by the first word line.

2. The programming method of claim 1, wherein the at least one verification operation comprises a first verification operation, and the step of verifying the target memory cell and the two periphery memory cells through the at least one verification operation to obtain the first verification result comprises:
   performing the first verification operation on the target memory cell to determine whether the target memory cell passes the first verification operation by using a first verification voltage; and
   performing the first verification operation respectively on the two periphery memory cells to respectively determine whether the two periphery memory cells pass the first verification operation by using the first verification voltage.

3. The programming method of claim 2, wherein the step of determining whether to perform the second programming operation or the third programming operation on the target memory cell according to the first verification result comprises:
   performing the second programming operation on the target memory cell when the target memory cell does not pass the first verification operation and only one of the two periphery memory cells passes the first verification operation; and
   performing the third programming operation on the target memory cell when the target memory cell does not pass the first verification operation and both of the two periphery memory cells pass the first verification operation.

4. The programming method of claim 3, further comprising:
   increasing the level of the passing voltage by a first correction amount and increasing the level of the programming voltage by a second correction amount during the second programming operation; and
   increasing the level of the passing voltage by a third correction amount and increasing the level of the programming voltage by the second correction amount during the third programming operation, wherein the third correction amount is greater than the first correction amount.

5. The programming method of claim 3, further comprising:
   verifying the target memory cell and the two periphery memory cells through the first verification operation to obtain a second verification result after the second programming operation is performed on the target memory cell, and determining whether to perform the second programming operation or the third programming operation on the target memory cell again according to the second verification result; and
   verifying the target memory cell through the first verification operation to obtain a third verification result after the third programming operation is performed on the target memory cell, and determining whether to perform the third programming operation on the target memory cell again according to the third verification result.

6. The programming method of claim 1, wherein the at least one verification operation further comprises a first verification operation and a second verification operation, and the step of verifying the target memory cell and the two periphery memory cells through the at least one verification operation to obtain the first verification result comprises:
   performing the first verification operation on the target memory cell to determine whether the target memory cell passes the first verification operation by using a first verification voltage;
   performing the first verification operation respectively on the two periphery memory cells to respectively determine whether the two periphery memory cells pass the first verification operation by using the first verification voltage;
   when the target memory cell does not pass the first verification operation and one of the two periphery memory cells passes the first verification operation, performing the second verification operation on the target memory cell to determine whether the target memory cell passes the second verification operation by using a second verification voltage, wherein the second verification voltage is less than the first verification voltage.

7. The programming method of claim 6, wherein the step of determining whether to perform the second programming operation or the third programming operation on the target memory cell according to the first verification result comprises:
   performing the second programming operation on the target memory cell when the target memory cell passes the second verification operation and only one of the two periphery memory cells passes the first verification operation; and
   performing the third programming operation on the target memory cell when the target memory cell passes the second verification operation and both of the two periphery memory cells pass the first verification operation.

8. The programming method of claim 7, further comprising:
   increasing the level of the passing voltage by a first correction amount and increasing the level of the programming voltage by a second correction amount during the second programming operation; and increasing the level of the passing voltage by a third correction amount and increasing the level of the programming voltage by the second correction amount during the third programming operation, wherein the third correction amount is greater than the first correction amount.

9. The programming method of claim 7, further comprising:

when the target memory cell does not pass the second verification operation, performing the first programming operation and the first verification operation on the target memory cell again to determine whether to return to the step of performing the second verification operation on the target memory cell;

verifying the target memory cell and the two periphery memory cells through the first verification operation to obtain a second verification result after the second programming operation is performed on the target memory cell, and determining whether to perform the second programming operation or the third programming operation on the target memory cell again according to the second verification result; and verifying the target memory cell through the first verification operation to obtain a third verification result after the third programming operation is performed on the target memory cell, and determining whether to perform the third programming operation on the target memory cell again according to the third verification result.

10. The programming method of claim 1, wherein the programming method of the memory array adopts an incremental step pulse programming method to increase the level of the programming voltage.

* * * * *